United States Patent [19]

Wilson

[11] Patent Number: 4,929,050
[45] Date of Patent: May 29, 1990

[54] TRAVELING WAVE FIBER OPTIC INTERFEROMETRIC SENSOR AND METHOD OF POLARIZATION POLING FIBER OPTIC

[75] Inventor: Mark L. Wilson, Vadnais Heights, Minn.

[73] Assignee: Unisys Corporation, Blue Bell, Pa.

[21] Appl. No.: 264,915

[22] Filed: Oct. 31, 1988

[51] Int. Cl.$^5$ .......................... G02B 6/02; G01B 9/02; G01D 5/34; B05D 5/06

[52] U.S. Cl. .......................... 250/227.17; 350/96.33; 350/96.34; 350/320; 350/96.29; 356/345; 356/349; 356/351; 250/231 R; 250/231 P; 250/227.19; 324/96; 427/163

[58] Field of Search ............... 350/96.10, 96.15, 96.29, 350/96.30, 96.33, 96.34, 320; 256/345, 349, 351; 250/227, 231 R, 231 P; 324/95, 96, 97; 427/162, 163

[56] References Cited

U.S. PATENT DOCUMENTS

| 3,891,302 | 6/1975 | Dabby et al. | 350/96.30 |
|---|---|---|---|
| 4,400,056 | 8/1983 | Cielo | 350/96.30 |
| 4,557,551 | 12/1985 | Dyott | 350/96.15 |
| 4,606,605 | 8/1986 | Ashkin et al. | 350/96.30 X |
| 4,608,273 | 8/1986 | Brambley | 350/96.29 X |
| 4,629,285 | 12/1986 | Carter et al. | 350/96.29 X |
| 4,669,814 | 6/1987 | Dyott | 350/96.29 X |
| 4,697,876 | 10/1987 | Dyott | 350/96.29 |
| 4,726,651 | 2/1988 | Wei et al. | 350/96.29 |
| 4,730,622 | 3/1988 | Cohen | 250/227 X |
| 4,743,870 | 5/1988 | Jen et al. | 350/96.29 X |
| 4,772,083 | 9/1988 | Ahmed | 350/96.29 |
| 4,781,425 | 11/1988 | Risk et al. | 350/96.15 |

FOREIGN PATENT DOCUMENTS 2148489  5/1985  United Kingdom ......... 350/96.29 X
2189900 11/1987  United Kingdom ......... 350/96.29 X

OTHER PUBLICATIONS

Lohmann, "Magneto-Optical Light Fibers", I.B.M. Tech Discl. Bull., vol. 12, No. 6, 11/69, pp. 788–789.
Bergot et al., "Generation of Permanent Optically . . .", Optics Lett., vol. 13, No. 7, 7/88, pp. 592–594.
Willson et al., "Magnetostrictive Fiber-Optic Sensor . . .", Optics Lett., vol. 8, No. 6, 6/83, pp. 333–335.
Donalds et al., "Electric Field Sensitive Optical Fibre . . .", Elect. Lett., vol. 18, No. 8, 4/82, pp. 327–328.

Primary Examiner—William L. Sikes
Assistant Examiner—Brian M. Healy
Attorney, Agent, or Firm—Glenn W. Bowen; Robert S. Bramson

[57] ABSTRACT

An optical light conducting fiber that has a D-shaped stress sensitive coating of PVF$_2$ which covers substantially equal length segments of said fiber, so that each of said segments is separated by equal uncoated segments of substantially the same length as said coated segments. The fiber when used in an interferometer provides an antenna that is capable of sensing electromagnetic and other stress-inducting waves in the environment. The optical fiber is polarized by winding it on a specially designed spool, heating it and applying a high intensity electric field in the desired direction.

32 Claims, 4 Drawing Sheets

PVF$_2$ EM SENSOR

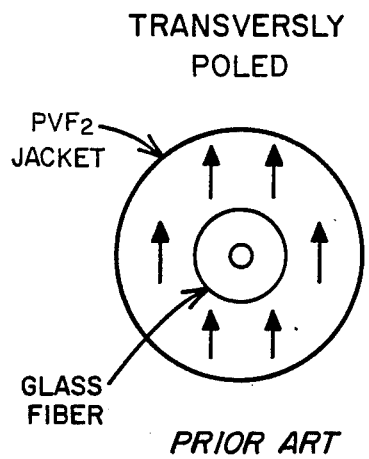
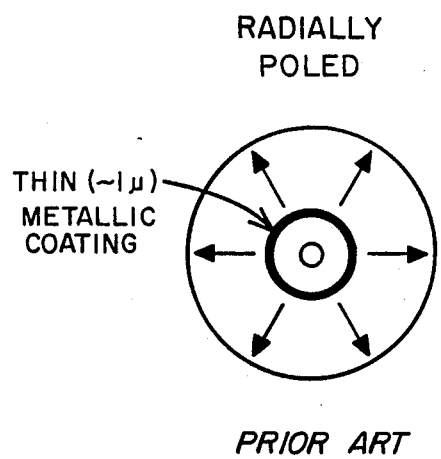
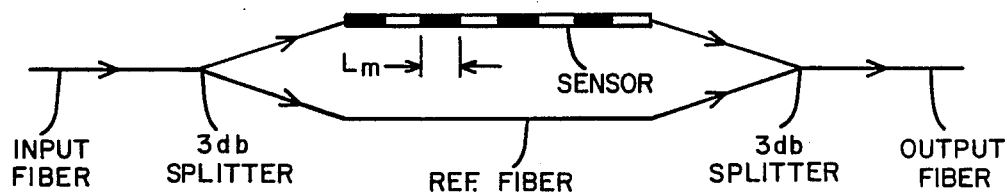
Fig. 2a  PVF₂ EM SENSOR
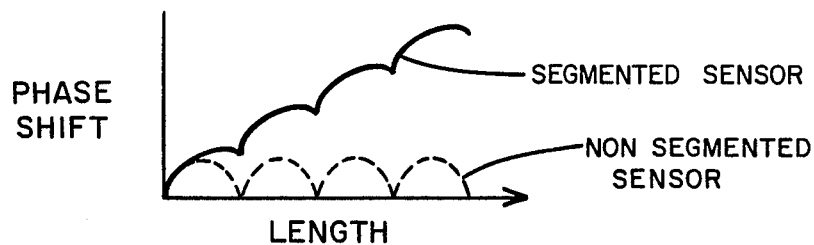
Fig. 2b

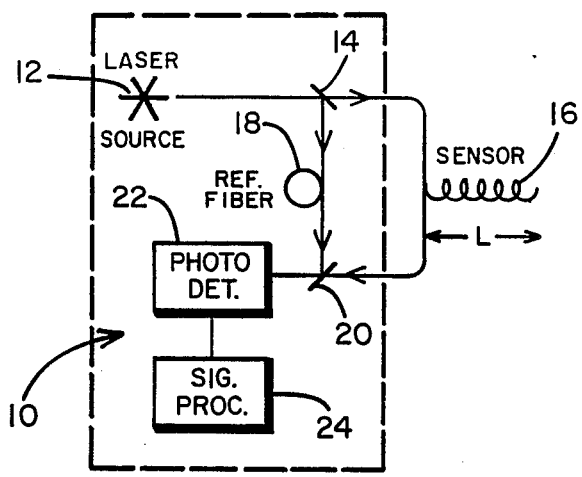
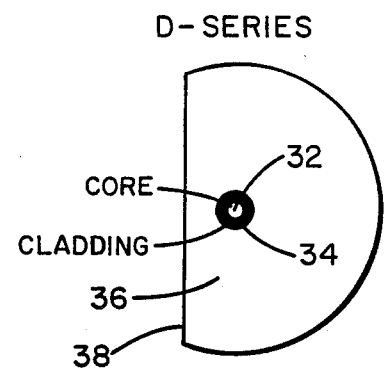
Fig. 3
Fig. 4
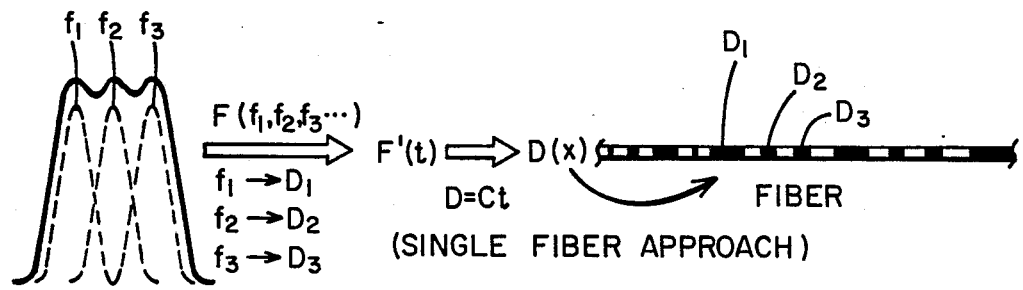
Fig. 10
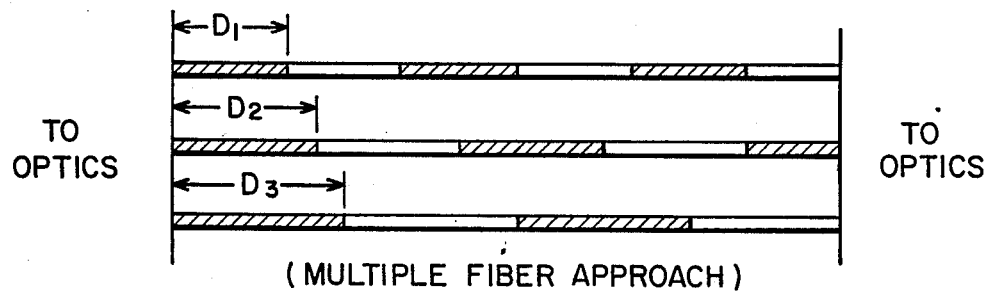
Fig. 11

TRAVELING WAVE FIBER OPTIC INTERFEROMETRIC SENSOR AND METHOD OF POLARIZATION POLING FIBER OPTIC

BACKGROUND OF THE INVENTION

1. Field of the Invention

The field of this invention is electromagnetic field fiber optic sensors.

2. Background Discussion

In the past decade, many different types of fiber optic sensors have been developed. The physical effects that these sensors monitor include temperature, pressure, electric field, magnetic field, acoustic acceleration, rotation, and velocity. These sensors have been developed due to the increased sensitivity, geometric versatility, and potential low cost that fiber optics affords.

The most sensitive type of fiber optic sensor is the "interferometric" type in which the output power from a laser is divided by a beam-splitter and both of these laser beams are coupled into separate fiber optic cables. Fiber optics which are of similar length and construction, but which differ slightly in that a coating has been applied to the outside surface of one of the fibers which makes the coated fiber sensitive to the physical effect to be monitored, may be used with such an interferometer.

The exposure of the coated fiber optic to the physical effect, such as an applied magnetic field, causes small changes in the coated fibers' length which are not seen in the uncoated fiber. When the two laser beams output by the coated and uncoated fibers are mixed together by a second beam-splitter they will either add constructively or destructively causing the light intensity input to the photo detector to vary. It is by monitoring the output signal from the photo detector that the physical effects can be determined.

The key in developing an interferometric fiber optic sensor is in finding the appropriate coating which sensitizes one of the fibers to the effect that is to be measured. Sometimes the other fiber needs to be coated as well to desensitize it to the same effect. Interferonmetric sensors are so sensitive that they may be affected by several physical effects, such as temperature or acoustic vibrations. Thus, it is sometimes necessary to isolate the uncoated or "reference" fiber in an environment as to minimize extraneous effects. Sometimes it is necessary for both fibers to be routed through nearly the same path to help subtract these extraneous effects.

With an appropriate coating, the fiber optic may be sensitive to microwave radiation, and these sensors may find numerous commercial and military applications. For example, this type of sensor with its high sensitivity can be used to detect distant microwave sources of either natural or man-made origin. Phased arrays may be used to determine the direction of arrival and the distance to the microwave source. Two different types of coating may have some utility in making the fiber sensitive to microwave energy.

Electrostrictive coatings, such as Polyvinylidene Fluoride ($PVF_2$), have been used in the past to make inteferometric electric field sensors and phase modulators. This material has a high sensitivity which yields a minimum detectable field strength of 6 micron volts per meter. A diagram describing two different configurations of a $PVF_2$ sensor is shown in FIG. 1a. In the first configuration, $PVF_2$ material is coated onto a piece of single mode fiber. The coated fiber is then heated slightly (50°-70° C.) and then exposed to a large external electric field. The electric field forces the polymer molecules to align along the electric field direction. This happens faster and at lower field strengths when the $PVF_2$ is slightly heated. After the sensor is cooled off the molecules remain polarized along the original electric field direction. The $PVF_2$ sensor is then "poled" and is now electrostrictive. In its original coated state, the $PVF_2$ molecules are randomly oriented and thus have no electrostrictive properties.

The second configuration of a $PVF_2$ sensor shown in FIG. 1b has the $PVF_2$ radially poled. In order to accomplish this, a thin metallic coating must be applied to the fiber optic before the $PVF_2$ material is applied. An electric field is then established between the thin metal coating on the fiber, and an external concentric circular metal electrode.

Another commonly used technique is to cover the outer surface of the $PVF_2$ material with a thin metal coating. The radial poling is useful when the $PVF_2$ sensor is to be used as a modulator since there are two electrodes (inner and outer metal coatings) to couple electrical signals into. The linearly poled sensor is useful for external fields.

As an electric field is applied across the poled $PVF_2$ sensor, it causes the molecules of the plastic to stress the fiber optic. This stress, through the photoelastic effect, causes the local index of refraction of the fiber to increase or decrease slightly. Since the uncoated reference fiber does not see any effect from the EM field when the sensor and reference fibers laser beams mix together, their phase-fronts add up constructively or destructively. This leads to intensity fluctuations which constitute the monitored signal.

A fundamental limitation to the use of $PVF_2$ or any interferometric sensor to monitor EM fields in the microwave range is the transit time of light through the fiber optic. At 1 GHz, the electric field reverses its sign every 0.5 ns. If the fiber sensor is accurately responding to the external electric field, the sign of the induced phase shift also reverses. Thus, the phase shift accumulated during the first half of the EM fields cycles is subtracted off during the second half. For fiber sensors greater than 10 centimeters in length, the resulting output phase of the sensor will never grow larger than that accumulated by a length of fiber $$Lm = \frac{C}{2nFm}$$

where Fm=Frequency of applied electric field and c/n=Speed of light in the fiber, A sensor of Lm would be able to respond to frequencies below Fm and slightly above Fm. But this sensor would have low gain making measurements of weak or distant sources difficult.

SUMMARY OF THE INVENTION

The present invention is an optical light conducting fiber that has a D-shaped stress sensitive coating of $PVF_2$ which covers substantially equal length segments of said fiber, so that each of said segments are separated by equal uncoated segments of substantially the same length as said coated segments. The fiber when used in an interferometer provides an antenna that is capable of sensing electromagnetic and other stress-inducting waves in the environment. The optical fiber is polarized by the steps of (a) winding a predetermined length of said fiber on a hollow spool which has a circumference that is substantially equal to one wavelength of a light source that is to be coupled to said fiber, (b) wrapping a metallic foil on said wrapped fiber on said spool, (c) grounding said foil to a reference ground, (d) placing a generally D-shaped electrically-conductive electrode that has a flat surface and a curved surface in the hollow inside of said spool so that the curved surface of said electrode is adjacent said fiber around substantially half of the inner circumference of said spool, (e) heating said electrode until said fiber reaches a temperature in the range of 50° C. to 70° C., (f) applying a voltage to said electrode to provide a sufficiently intense electrical field to polarize said stress-sensitive coating, and (g) terminating said heating and the application of said voltage.

BRIEF DESCRIPTION OF THE DRAWINGS

The present invention is illustrated by reference to the drawings in which:

FIGS. 1a and 1b are cross-sectional views that show prior art transverse and radially polarized polymer coated optical sensing fibers;

FIG. 2a is a schematic illustration of a poled fiber sensor and reference fiber sensor for use in the present invention;

FIG. 2b is a graph of phase shift versus length for the fibers of FIG. 2a;

FIG. 3 is a schematic of one version of a system constructed in accordance with the present invention;

FIG. 4 is a cross-sectional view of the D-shaped fiber of the present invention;

FIG. 10 shows a Fourier transform of the signal from the segmented optical fiber sensor of FIG. 10(b); and FIG. 11 is an alternate multiple segmented optical fiber sensor.

TECHNICAL DESCRIPTION OF THE INVENTION

Figure 5:
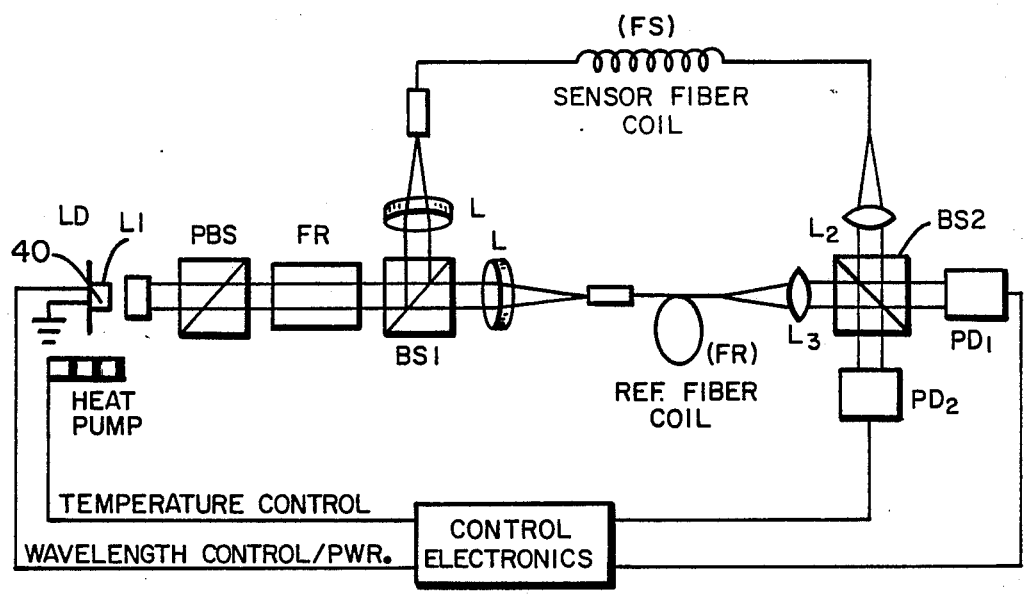
FIG. 5 is a schematic of an alternate version of a system constructed in accordance with the present invention.

A more sensitive fiber optic R.F. sensor than previously available may be constructed by shielding, or periodically poling, a short section of a long fiber. A diagram of this type of sensor is shown in FIG. 2a. By shielding or not poling 50% of the fiber with a cycle of length 2Lm, the phase shifts induced in the active regions of the fiber sensor are not decreased in the inactive regions. Thus small phase shifts accumulate to a measurable level as the length of the poled fiber sensor increases, as shown in FIG. 2b. While the gain of the sensor is increased, the bandwidth over which the fiber sensor will function decreases dramatically. The longer the sensor fiber, the larger the induced phase shift and the smaller the bandwidth.

The gain-bandwidth product of the sensor is constant. For example, if a fiber sensor of length Lm=10 cm, the bandwidth of this sensor would be 1GHz with a gain of 1. If a sensor was fabricated by shielding half the sensor fiber, or by poling half the fiber such that its length is 1000 $L_m$ or 100 meters, the new longer sensor would have approximately 500 times less bandwidth. The fact that this bandwidth would be centered around the design frequency Fm is shown in the equation $$Lm = \frac{C}{2nFm}.$$

For the previously mentioned example, the bandwidth of a 100 meter sensor with LM=10 cm would be approximately 2MHz. Thus, in order to get high gain while covering a wide bandwidth, many antennas, each selectively tuned for a particular bandwidth, would have to be fabricated. It may be possible to have several different bandwidths covered by a single fiber sensor by activating the fiber with many different length structures.

An RF/EF sensor may be constructed using micro optical components to build a Mach-Zehnder Interferometer. FIG. 3 illustrates the construction of the system 10. The output beam from a frequency stabilized HeNe laser 12 is spatially filtered and expanded in diameter (by conventional components not shown) and then input to a beam-splitter 14. One half of the laser's output energy is coupled into the sensor fiber 16, while the other half is propagated around a free-air reference loop 18. The two beams are then combined by a second beam-splitter 20 The interference effects are monitored using a wide bandwidth photo detector 22 and an RF signal processor 24, such as a spectrum analyzer. The two paths are recombined, and the resultant beam contains information corresponding to the difference seen in optical paths travelled by the two beams.

The sensor fiber may be constructed using a short piece of "D" shaped Polarization Preserving Single Mode (PPSM) fiber with a Polyvinylidene Fluoride copolymer (PVDF) laminated to the PPSM fiber which is then poled by researchers. A diagram of such a D-shaped sensor fiber 30 is shown in FIG. 4. This type of fiber was chosen to allow the stress generated by the piezostrictive coating 32 to be very close to the fiber optic core 12 which may be a Germanium-doped core with a Fluorine-doped cladding 34 so as to maximize the fibers sensitivity to external perturbations. The body 36 of the fiber may be composed of a high grade natural silica.

In previous experiments, researchers have attempted to make high frequency phase modulators by coating PVDF on round single mode fibers. In these studies, the electric field is applied using concentric metallic electrodes deposited on the fiber and on the outer surface of the film. The experimental results of these previous studies show the sensitivity of the PVDF coated fiber to be nonlinear due to radial resonances of the polymer film and of the glass fiber. This is largely due to the cylindrical symmetry of the coated fiber used to make the phase modulator. This type of fiber will have a relatively smooth frequency response, which is what is required for an antenna to avoid saturation or other nonlinearities.

The sensor fiber of the described embodiment may be poled such that the polarization vector is normal to the flat surface 38 of the "D" fiber. A low Q results from the unique "D" shaped fiber which does not support radial resonances nearly so much as a round fiber.

Frequency responses of several Gigahertz along with sensitivities of approximately 20 microradians per volt per meter of fiber length may be obtained with the present invention. The fibers can respond linearly to electric fields between 0 and 100,000 volts/meter.

The coating on the fiber is a copolymer of vinylidene fluoride with trifluoroethylene, $P(VDF_x\text{-}TrFE_{I-x})$. The fiber may be sandwiched between two layers of this coating. The fiber/copolymer combination may then be subsequently poled in a high intensity electric field so as to align the orientation of the polar molecules in the copolymer. The poling field leaves the copolymer with a piezostrictive property. The copolymer jacket can then be used to convert electric field to a stress on the fiber. The stress causes a change of index of refraction of the fiber core causing a change in optical phase which is measured at the output of the interferometer.

PVDF is a piezostrictive copolymer which has been shown to respond to frequencies as high as 20 GHz. The ambient electric field causes the PVDF film to stress. This stress causes a change in the index of refraction of the PPSM fiber's core because the stressed film is only a few microns away from the core by virtue of the "D" shape of the fiber. Thus, the phase of the laser energy propagating through the fiber's core is modulated by the ambient electric field. This phase modulation then is turned into an intensity variation by the Mach-Zehnder Interferometer.

Another version of an electromagnetic field sensor in accordance with the present invention is shown in FIG. 5. The output from a laser diode (LD) is collimated by a lens ($L_1$). This collimated beam then passes through a polarizing prism (PP) and a Faraday rotator (FR). These components ensure a stable highly polarized laser source for the interferometer. The stabilized laser beam is divided into two equal power beams by a beam splitter ($BS_1$). These laser beams are coupled into two optical fibers. One fiber (FR) is the reference leg fiber and the other fiber (FS) is the sensor leg fiber of the interferometer. The laser beams exiting from the other end of the fibers are collimated by lenses ($L_2, L_3$) and then mixed together using a beam splitting prism (BS2). The output beams are then monitored by photodiodes. The photodiodes' ($PD_1, PD_2$) signals are input into control electronics (CE) which controls the laser diodes' wavelength. This allows the operation of the interferometer at "quadrature" for maximum sensitivity, and also makes it possible to minimize signals caused by temperature or vibration induced changes in the interferometer.

Figure 6:
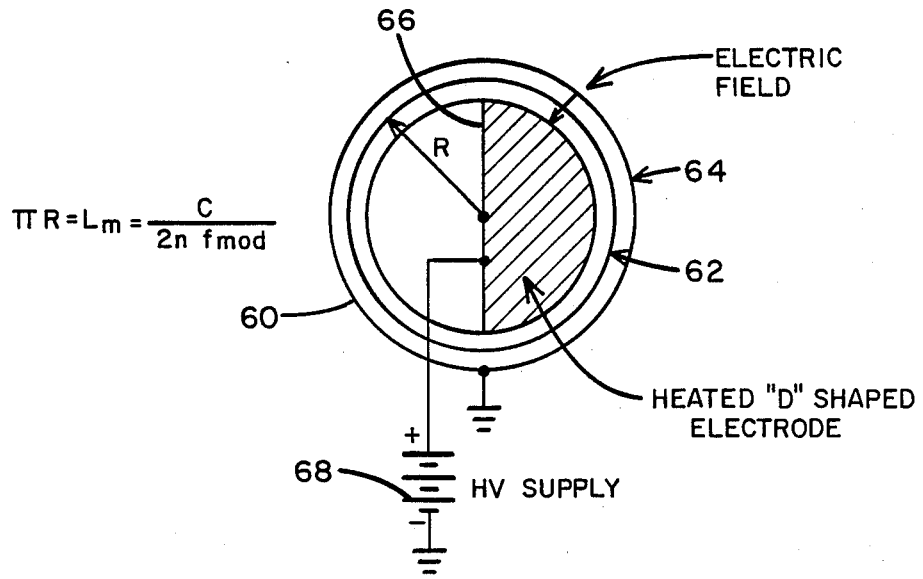
FIG. 6 is a cross-sectional view of a D-shaped fiber and apparatus for polarizing the fiber in a radial direction.

One technique that may be used to pole the fiber is shown in FIG. 6. The fiber 60 is wound onto a thin lexan cylinder spool 62 which has a circumference equal to the distance light travels in the fiber during on cycle of the electro-magnetic field. After all the fiber is on the cylinder, the fiber covered cylinder is wrapped with a metallic foil 64 which is electrically connected to ground. A slightly heated, electrically isolated inner metallic electrode 66 which is shaped like the letter "D" is placed inside the lexan cylinder so that the outer curved surface of the electrode is very close to the fiber optic. The heaters are turned on until the fiber reaches a temperature between 50° C. to 70° C. Then a high voltage from a high voltage supply 68 is connected to the inner electrode so that a strong electric field exists in the region containing the fiber optic. After a few minutes the voltage on the inner electrode and the heating current is turned off. After the fiber cools back down to ambient, the fiber should now be poled in the plane perpendicular to the incident electromagnetic waves propagation direction. The fiber is then carefully removed from the poling system and wound onto a sensor spool (not shown) for use in the system of FIG. 5.

Figure 7:
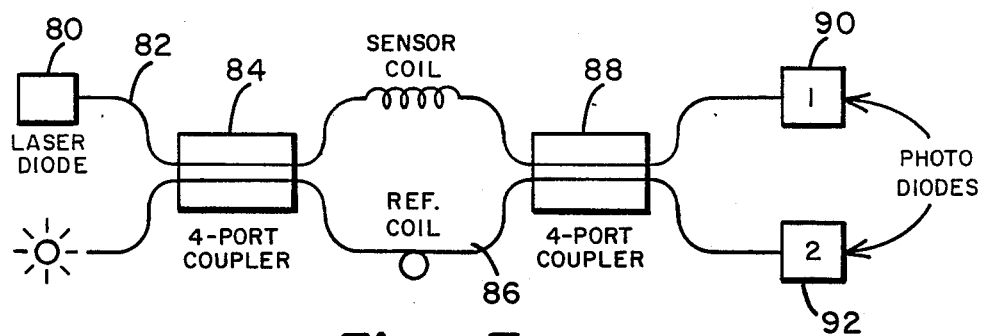
FIG. 7 is a schematic of an embodiment of the present invention that utilizes a Mach Zendher interferometer configuration.
Figure 8:
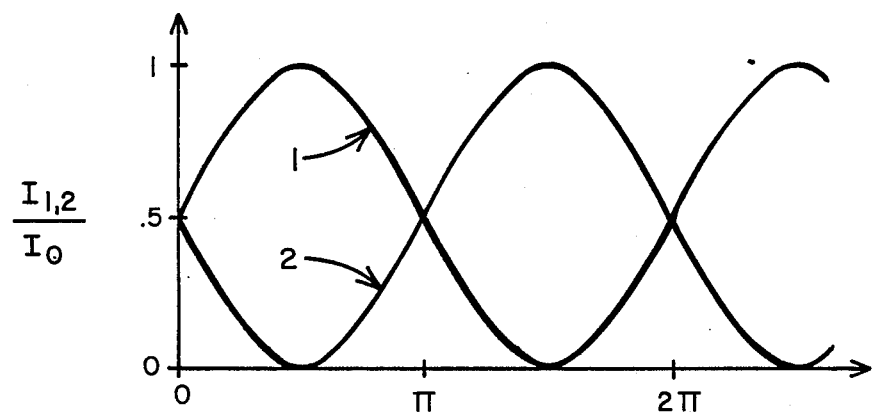
FIG. 8 is a plot of the output optical power as a function of the transfer function for the embodiment of FIG. 7.
Figure 9:
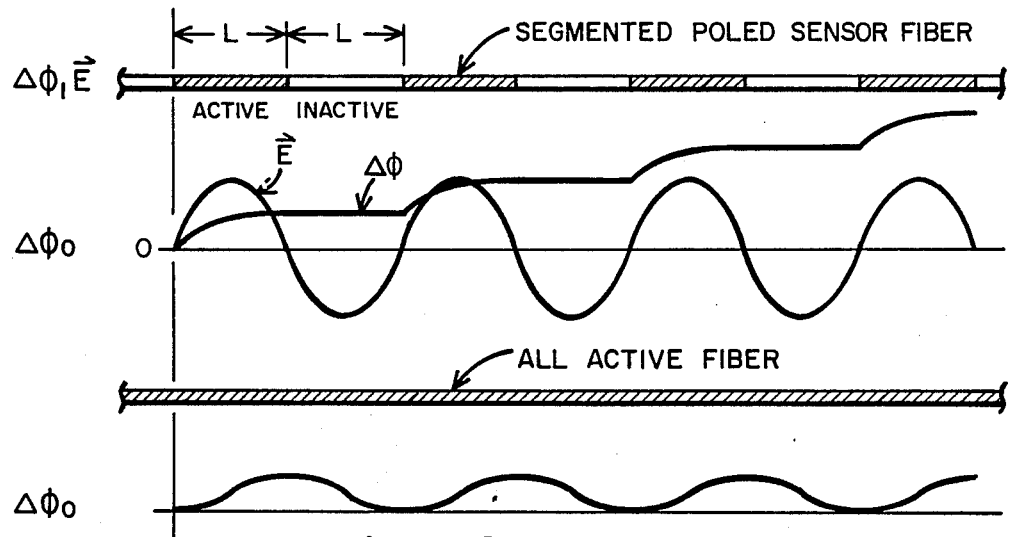
FIG. 9 illustrates the variation in phase between a segmented and an unsegmented optical fiber sensor.

Another embodiment of the present invention is shown in FIG. 7 in which an RF antenna is constructed totally using fiber optic devices, which allows the system to be very compact. The output power from a temperature controlled and stabilized laser diode 80 is coupled into a Polarization Preserving Single Mode (PPSM) sensor optical fiber coil 82 using conventional techniques. The laser emits very coherent light preferably with a coherence length of over 100 meters. The optical power flowing through the PPSM fiber is directed toward a four port coupler 84 which divides the output power into the sensor fiber and two equal power laser beams both of which propagate inside the reference PPSM fiber 86.

The sensor coil fiber is a length of a custom coated PPSM fiber, which has a piezostrictive coating which has been sensitized to stress the fiber when an electric field is applied to the coating. The reference fiber may be of standard construction without any special coatings. After a reasonable length of fiber (10 to 1000 meters) the two separate PPSM fibers are directed into another four port coupler 88 which acts as an optical equivalent to a mixer. This type of optical system is commonly called an "Mach Zendher Interferometer." A diagram of this system is shown in FIG. 1.

If the phase of the optical signal propagating in the custom coated (sensor) fiber 82 is in phase with the phase of the optical signal propagating in the standard (reference) fiber coil 86, both output ports of the second four port coupler 88 will have equal output power. However, if a phase difference exists between the sensor and reference fiber, the output optical power will exit according to the transfer function shown in FIG. 2. It may be noted that if the phase difference is $(N+\frac{1}{2})$, all of the output power will exit out of one port of the four port coupler.

Photo diodes 90, 92 are used to monitor the laser power exiting the output ports of the coupler. Thus, any effect which causes the phase of laser signals propagating in the two fibers to be different will cause an intensity variation on the photo diodes 90, 92. Thermal or vibrational effects can cause such a variation. However, these signals tend to be baseband, with bandwidth of a few Hertz to a few kilohertz.

The phase variation caused by an external RF electric field interacting with the custom piezoelectric coating on the sensor fiber will generally be at the frequency of the RF electric field (10 to 1000 MHZ). By using available sensitive RF spectrum analyzer (not shown) to monitor the output of the photodiodes, an electrical signal will be detected at the frequency of the applied signal. The magnitude of the signal will follow the magnitude of the applied electric field. However, the instantaneous magnitude of this signal can vary at low frequencies due to additional effects such a temperature. The variation of the magnitude of the signal can be reduced by inserting a conventional electrically tunable phase control (not shown) element in the reference leg of the interferometer, which is adjusted to cancel thermal or vibrational effects.

As frequency of the external RF electric field increases, the direction of the electric field vector can change as the light propagates through a long portion of the sensor fiber. Thus if the stress induced phase shift in the sensor fiber is a linear effect, the phase accumulated during the positive half of the RF cycle will be canceled off by the effects of the negative half of the cycle. FIG. 3 explains this in graphic detail. Thus the accumulated phase shift does not grow as the fiber gets longer. However, if the piezostrictive action of the sensor fiber is activated on one portion of the fiber and deactivated on another, then a pattern is applied to the fiber which allows the phase shift to accumulate over long lengths of fiber.

For a phase shift gain at a single frequency, the sensor fiber has an active length D and an equal inactive length where the fiber is not coated, where D is the half wavelength of the RF signal that is to be monitored. As shown in FIG. 3, the phase accumulates through the first section of fiber, and then the phase shift is held through the next length. This effect repeats over and over again until the light leaves the sensor fiber. While this technique provides gain at a particular frequency, it does not provide gain at a wide range of frequencies.

In order for the fiber antenna to have the required center frequency, gain, and bandwidth, a spatial pattern which is the Fourier transform of the required bandwidth must be written on the fiber. A representative transform is shown in FIG. 10a for the sensor of FIG. 10b which is configured with an alternating pattern of coating lengths $D_1$, $D_2$ and $D_3$ which respectively correspond to one-half wavelength frequencies $F_1$, $F_2$ and $F_3$ respectively. Thus the fiber will be written with several spatial frequencies each of which offers gain to the phase signal at a specific frequency. Another alternative to this would be to have several fibers in parallel each of which had a specific spatial frequency which would then be sensitive to a particular RF signal, as shown in FIG. 4.

The spatial pattern can be easily written onto the PVDF coated sensor fiber as follows. A long length of the PPSM fiber is coated with the piezostrictive PVDF film, and the entire length of the coated fiber is polarized by exposing the PVDF film to a very high electric field. The fiber may then be passed through a CO2 laser beam which is modulated in such a manner as to heat one part of the fiber while not heating another. If the velocity of the fiber is held constant, and the CO2 lasers power is high enough, the PVDF film can be heated to over 150° C., which will cause the PVDF film to loose its piezostrictive properties in the inactive regions.

What is claimed:

1. A fiber optic sensing element comprising an optical light conducting fiber and a stress sensitive coating over a periodic group of substantially equal length segments of said fiber, wherein each of said segments are separated by equal uncoated segments of substantially the same length as said coated segments.

2. A fiber optic sensing element comprising an optical light conducting fiber and a stress sensitive coating which covers substantially equal length segments of said fiber as claimed in claim 1, wherein said coating has a D-shaped profile having a flat surface and a curved surface, and said coating is applied so said fiber is adjacent said flat surface.

3. A fiber optic sensing element comprising an optical light conducting fiber and a stress sensitive coating which covers substantially equal length segments of said fiber as claimed in claim 1, wherein said coating comprises polyvinylfluoride ($PVF_2$).

4. A fiber optic sensing element comprising an optical light conducting fiber and a stress sensitive coating which covers substantially equal length segments of said fiber as claimed in claim 3, wherein said coating has a D-shaped profile having a flat surface and a curved surface, and said coating is applied so said fiber is adjacent said flat surface.

5. In an optical interferometer comprising signal optical means, reference optical means and measuring means for comparing signals conducted by said signal optical means and said reference optical means the improvement wherein said reference optical means comprises relatively a stress-insensitive optical fiber and said signal means comprises a stress sensitive coating which covers substantially a periodic group of equal length segments of said fiber wherein each of said segments are separated by equal uncoated segments of substantially the same length as said coated segments.

6. In an optical interferometer as claimed in claim 5, the further improvement wherein said coating has a D-shaped profile having a flat surface and a curved surface, and said coating is applied so said fiber is adjacent said flat surface.

7. In an optical interferometer as claimed in claim 5, the further improvement wherein said coating comprises polyvinylfluoride ($PVF_2$).

8. In an optical interferometer as claimed in claim 7, the further improvement wherein said coating has a D-shaped profile having a flat surface and a curved surface, and said coating is applied so said fiber is adjacent said flat surface.

9. A method of polarization poling of an optical fiber having a polarizable stress-sensitive coating over at least a portion of the total length of said fiber comprising the steps of
    (a) winding a predetermined length of said fiber on a hollow spool which has a circumference that is substantially equal to one wavelength of a light source that is to be coupled to said fiber,
    (b) wrapping a metallic foil on said wrapped fiber on said spool,
    (c) grounding said foil to a reference ground,
    (d) placing a generally D-shaped electrically-conductive electrode having a flat surface and a curved surface in the hollow inside of said spool so that the curved surface of said electrode is adjacent said fiber around substantially half of the inner circumference of said spool,
    (e) heating said electrode until said fiber reaches a temperature in the range of 50° C. to 70° C.,
    (f) applying a voltage to said electrode to provide a sufficiently intense electrical field to polarize said stress-sensitive coating, and
    (g) terminating said heating and the application of said voltage.

10. A method as claimed in claim 9 wherein said stress-sensitive coating has a D-shaped profile having a flat surface and a curved surface, and said coating is applied so said fiber is adjacent said flat surface.

11. A method as claimed in claim 9 wherein said coating comprises polyvinylfluoride ($PVF_2$).

12. A method as claimed in claim 9 wherein stress-sensitive coating covers substantially equal length segments of said fiber wherein each of said segments are segmented by equal uncoated segments of substantially the same length of said coated segments.

13. A method as claimed in claim 10 wherein said coating comprises polyvinylfluoride (PVF$_2$)

14. A method as claimed in claim 10 wherein stress-sensitive coating covers substantially equal length segments of said fiber wherein each of said segments are segmented by equal uncoated segments of substantially the same length of said coated segments.

15. A method as claimed in claim 12 wherein said coating comprises polyvinylfluoride (PVF$_2$).

16. A method as claimed in claim 15 wherein said stress-sensitive coating has a D-shaped profile having a flat surface and a curved surface, and said coating is applied so said fiber is adjacent said flat surface.

17. In an optical interferometer as claimed in claim 5 the improvement comprising at least one additional sensor optical means comprising a stress-sensitive coating which covers substantially equal length segments of said fiber, wherein each of said segments on each of said sensor optical means comprise periodic groups of different length segments, and each of said segments on any one fiber is separated by equal uncoated segments of substantially the same length as said coated segments on said same one fiber.

18. In an optical interferometer as claimed in claim 17, the further improvement wherein said coating has a D-shaped profile having a flat surface and a curved surface, and said coating is applied so said fiber is adjacent said flat surface.

19. In an optical interferometer as claimed in claim 17, the further improvement wherein said coating comprises polyvinylfluoride (PVF$_2$).

20. In an optical interferometer as claimed in claim 19, the further improvement wherein said coating has a D-shaped profile having a flat surface and a curved surface, and said coating is applied so said fiber is adjacent said flat surface.

21. In an optical interferometer as claimed in claim 5 the improvement comprising at least one additional periodic group of substantially equal length segments of a stress-sensitive coating, wherein each of said coated segments in any given periodic group is separated by uncoated segments of the same length as said coated segments of said given periodic group.

22. In an optical interferometer as claimed in claim 21, the further improvement wherein said coating has a D-shaped profile having a flat surface and a curved surface, and said coating is applied so said fiber is adjacent said flat surface.

23. In an optical interferometer as claimed in claim 21, the further improvement wherein said coating comprises polyvinylfluoride (PVF$_2$).

24. In an optical interferometer as claimed in claim 23, the further improvement wherein said coating has a D-shaped profile having a flat surface and a curved surface, and said coating is applied so said fiber is adjacent said flat surface.

25. An optical interferometer means for comparing light in a sensor beam with light in a reference beam comprising sensor beam conduit means, reference beam conduit means, light source means for generating said sensor and said reference teams, coupling means for coupling said sensor and said reference beams into said sensor and said reference conduit means, respectively, and light detector means for receiving and electing said sensor and said reference beams from said sensor and said reference conduit means, respectively, wherein said reference conduit means comprises an optical light conducting reference fiber with a stress sensitive coating over a continuous segment of said reference fiber and said sensor conduit means comprises an optical light conducting sensor fiber with a stress sensitive coating over substantially equal length segments of said fiber, wherein each of said segments are separated by equal uncoated segments of substantially the same length as said coated segments.

26. In an optical interferometer as claimed in claim 25, the further improvement wherein said coating has a D-shaped profile having a flat surface and a curved surface, and said coating is applied so said fiber is adjacent said flat surface.

27. In an optical interferometer as claimed in claim 25, the further improvement wherein said coating comprises polyvinylfluoride (PVF$_2$).

28. In an optical interferometer as claimed in claim 27, the further improvement wherein said coating has a D-shaped profile having a flat surface and a curved surface, and said coating is applied so said fiber is adjacent said flat surface.

29. In an optical interferometer as claimed in claim 25 the improvement comprising at least one additional periodic group of substantially equal length segments of a stress-sensitive coating, wherein each of said coated segments in any given periodic group is separated by uncoated segments of the same length as said coated segments of said given periodic group.

30. In an optical interferometer as claimed in claim 27, the further improvement wherein said coating has a D-shaped profile having a flat surface and a curved surface, and said coating is applied so said fiber is adjacent said flat surface.

31. In an optical interferometer as claimed in claim 29, the further improvement wherein said coating comprises polyvinylfluoride (PVF$_2$).

32. In an optical interferometer as claimed in claim 31, the further improvement wherein said coating has a D-shaped profile having a flat surface and a curved surface, and said coating is applied so said fiber is adjacent said flat surface.

* * * * *